(12) United States Patent
Kitamura et al.

(10) Patent No.: US 10,353,437 B1
(45) Date of Patent: Jul. 16, 2019

(54) COUPLED STRUCTURE AND ELECTRONIC DEVICE

(71) Applicant: LENOVO (SINGAPORE) PTE. LTD., Singapore (SG)

(72) Inventors: Masahiro Kitamura, Yokohama (JP); Mitsuo Horiuchi, Yokohama (JP); Satoshi Douzono, Yokohama (JP)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 0 days.

(21) Appl. No.: 16/027,333

(22) Filed: Jul. 4, 2018

(30) Foreign Application Priority Data

Apr. 5, 2018 (JP) .................................. 2018-072922

(51) Int. Cl.
*G06F 1/16* (2006.01)
*H05K 5/00* (2006.01)

(52) U.S. Cl.
CPC ............ *G06F 1/1669* (2013.01); *G06F 1/169* (2013.01); *G06F 1/1662* (2013.01); *G06F 1/1684* (2013.01); *H05K 5/0013* (2013.01)

(58) Field of Classification Search
CPC .... G06F 1/1616; G06F 1/1662; G06F 1/1635; G06F 1/1637; G06F 1/166; G06F 1/169; G06F 1/1656; G06F 1/1684; G06F 3/0202; G06F 1/1679; H01H 13/70; H01H 13/702; H01H 13/705; H01H 2221/016; H01H 2221/044; G06K 7/0013; H05K 5/0013
See application file for complete search history.

(56) References Cited

U.S. PATENT DOCUMENTS

| | | | | |
|---|---|---|---|---|
| 5,535,091 A * | 7/1996 | Lee | ...................... | H01H 13/702 248/220.21 |
| 5,608,603 A * | 3/1997 | Su | ......................... | G06F 3/0202 200/303 |
| 6,085,974 A * | 7/2000 | Inoue | .................... | G06K 7/0013 235/380 |
| 8,132,975 B2 * | 3/2012 | Tracy | .................... | G06F 1/1616 400/472 |
| 8,279,590 B2 * | 10/2012 | Kito | ....................... | G06F 1/1616 345/168 |
| 9,497,878 B2 * | 11/2016 | Huang | ................. | H05K 7/1417 |
| 2005/0094380 A1 * | 5/2005 | Mukougawa | ........ | H05K 5/0013 361/724 |
| 2007/0146976 A1 * | 6/2007 | Lin | ....................... | G06F 1/1616 361/679.08 |

(Continued)

FOREIGN PATENT DOCUMENTS

JP 11265251 A 9/1999

*Primary Examiner* — Dimary S Lopez Cruz
*Assistant Examiner* — Abhishek M Rathod
(74) *Attorney, Agent, or Firm* — Shimokaji IP

(57) ABSTRACT

A coupled structure is capable of suppressing breakage of a hook member and keeping the coupled state between members. An electronic device includes the coupled structure. A coupled structure is a keyboard unit coupled to a main body chassis. The coupled structure includes an engagement hole on the keyboard unit and a hook member that protrudes from an upper face of a support plate on the main body chassis and can be engaged with the engagement hole. The support plate has a plate spring capable of elastic displacement with respect to a peripheral part. The hook member is on the plate spring.

4 Claims, 7 Drawing Sheets

(56) References Cited

U.S. PATENT DOCUMENTS

| | | | |
|---|---|---|---|
| 2008/0285216 A1* | 11/2008 | Kobayashi | G06F 1/1616 361/679.08 |
| 2011/0170243 A1* | 7/2011 | Lin | G06F 1/1616 361/679.01 |
| 2015/0291789 A1* | 10/2015 | Hirata | C08J 5/047 523/468 |
| 2016/0139637 A1* | 5/2016 | Doi | G06F 1/1679 361/679.4 |
| 2017/0024029 A1* | 1/2017 | Kitamura | G06F 1/1662 |

* cited by examiner

COUPLED STRUCTURE AND ELECTRONIC DEVICE

FIELD OF THE INVENTION

The present invention relates to a coupled structure including two coupled members and an electronic device including such a coupled structure.

BACKGROUND OF THE INVENTION

An electronic device, such as a laptop personal computer (laptop PC), typically includes a keyboard unit attached to an upper face of a chassis (hereinafter called a main body chassis) of its main body. For example, Patent Document 1 discloses a configuration in which a recess is provided on the upper face of the main body chassis so that a keyboard unit is stored in this recess. This keyboard unit has a hook member protruding from its lower face, and the keyboard unit is fixed to the main body chassis by engaging the hook member with an engagement hole provided on a bottom face of the recess.

[Patent Document 1] Japanese Patent Application Laid-Open No. 11-265251

SUMMARY OF THE INVENTION

Incidentally, in a case where an electronic device with a keyboard unit coupled with its main body chassis via a hook member, like the one disclosed in Patent Document 1, is subjected to an impact due to falling or something, the keyboard unit may be subjected to a huge load in a direction of separating from the main body chassis. Then, between the keyboard unit and the main body chassis, stress concentration occurs in the root of the hook member, which brings concern that the hook member may come off of the root or be broken. If the hook member is broken, the keyboard unit may be detached from the main body chassis, or the coupled state of the two may become loose and unstable.

In view of the problems of the conventional techniques, the present invention aims to provide a coupled structure capable of suppressing breakage of a hook member and keeping the coupled state between members and an electronic device including the coupled structure.

A coupled structure according to the first aspect of the present invention is a first member coupled with a second member. The coupled structure includes an engagement hole provided on the first member; and a hook member that protrudes from a surface of a plate-like part provided on the second member, and can be engaged with the engagement hole. The plate-like part has a plate spring capable of elastic displacement with respect to a peripheral part. The hook member is provided on the plate-like part.

According to this configuration, for example, when an impact in a direction of separating the first and second members from each other is applied due to falling or something of the coupled structure, and the hook member is subjected to a load, the plate spring is elastically displaced with respect to the peripheral part, and the hook member is displaced in a state where the hook member is engaged with the engagement hole. This suppresses the occurrence of stress concentration in the boundary between the hook member and the plate-like part. As a result, it is possible to prevent the root of the hook member from coming off of the plate-like part, or is possible to prevent the occurrence of cracks or something in a claw of the hook member or its surrounding.

The plate-like part may be configured to be provided with a notch-like hole that is provided so as to surround three sides of the hook member and has the plate spring inside thereof. Then, it is possible to form a plate spring that elastically displaces the hook member with a simple configuration.

The hook member may be configured to have a base standing from a surface of the plate spring and a claw bending from the distal end of the base along the surface, and the notch-like hole may be configured to have a pair of side holes provided on both sides of the hook member and a back hole provided on the back of the base that is the opposite side of the claw in a protruding direction so that the back hole connects between the side holes. Then, when the plate spring is elastically displaced with respect to the peripheral part, the hook member turns in a direction in which the claw is engaged with an engagement part more firmly. As a result, it is possible to prevent the hook member from being detached from the engagement hole.

The plate-like part and the hook member may be configured to be integrally molded from resin material including reinforced fiber, and the hook member may be configured to have an R-shaped portion in the root thereof so that the R-shaped portion protrudes from the plate spring. Then, inside the root of the hook member where stress concentration is most likely to occur, the reinforced fiber is disposed in an arc along the R-shaped portion. Therefore, even when the hook member is subjected to a load, the root is made extremely firm by the reinforced fiber extending along the R-shaped portion; therefore, it is possible to prevent the occurrence of coming off or cracks from this part.

A coupled structure according to the second aspect of the present invention is a first member coupled with a second member. The coupled structure includes an engagement hole provided on the first member; and a hook member that protrudes from a surface of a plate-like part provided on the second member, and can be engaged with the engagement hole. The plate-like part and the hook member are integrally molded from resin material including reinforced fiber. The hook member has an R-shaped root protruding from the plate-like part.

An electronic device according to the third aspect of the present invention is an electronic device including a coupled structure having the above-described configuration. The first member is a keyboard unit, and the second member is a chassis that the keyboard unit is mounted on an upper face thereof.

The above-described aspects of the present invention can suppress breakage of the hook member and keep the coupled state between the members.

DETAILED DESCRIPTION OF THE INVENTION

Referring to the attached drawings, the following describes a coupled structure according to the present invention in details, by way of a preferable embodiment of an electronic device including such a coupled structure.

Figure 1:
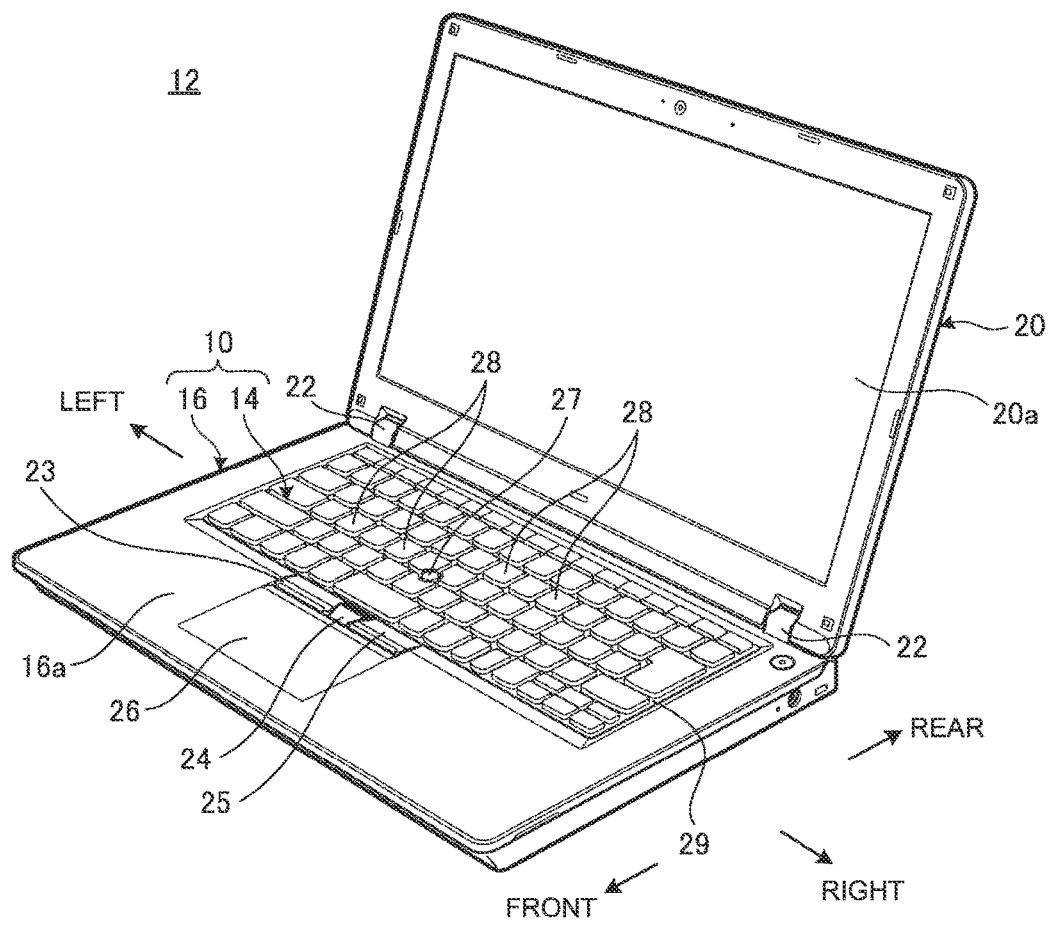
FIG. 1 is a perspective view of an electronic device including a coupled structure according to one embodiment of the present invention.

FIG. 1 is a perspective view of an electronic device including a coupled structure 10 according to one embodiment of the present invention. The coupled structure 10 is a keyboard unit 14 coupled with a main body chassis 16. In the following description of the coupled structure 10, referring to the keyboard unit mounted on the electronic device 12 for use shown in FIG. 1, the forward and the back are called front and rear, respectively, the thickness direction is called vertically (up and down), and the width direction is called left and right.

As shown in FIG. 1, the electronic device 12 is a laptop PC, including the main body chassis 16 having the keyboard unit 14 and a display chassis 20 having a display unit 20a, such as a liquid crystal display. The display chassis 20 is openably/closably coupled with the main body chassis 16 via a pair of right and left hinges 22, 22.

Inside the main body chassis 16, various electronic components (not shown) such as a board, an arithmetic processing unit, a hard disk device, and a memory are stored. On an upper face 16a of the main body chassis 16, the keyboard unit 14, push buttons 23, 24, and 25, and a touchpad 26 are disposed in this order from the rear to the front. The keyboard unit 14 has a pointing stick 27 roughly in the center thereof.

The keyboard unit 14 is an isolation type having a plurality of keys 28 that are isolated with a frame 29 surrounding the keys 28. That is, the frame 29 has a plurality of holes, into which keytops of the keys 28 are inserted to be movable vertically. The touchpad 26 and the pointing stick 27 are for controlling a cursor (a mouse pointer) displayed on the display unit 20a, and are an alternative input means of a mouse. The push buttons 23 to 25 link with the touchpad 26 or the pointing stick 27 to control the cursor. For instance, the push buttons 23 to 25 correspond to left, center, and right buttons of a typical mouse, respectively.

Figure 2:
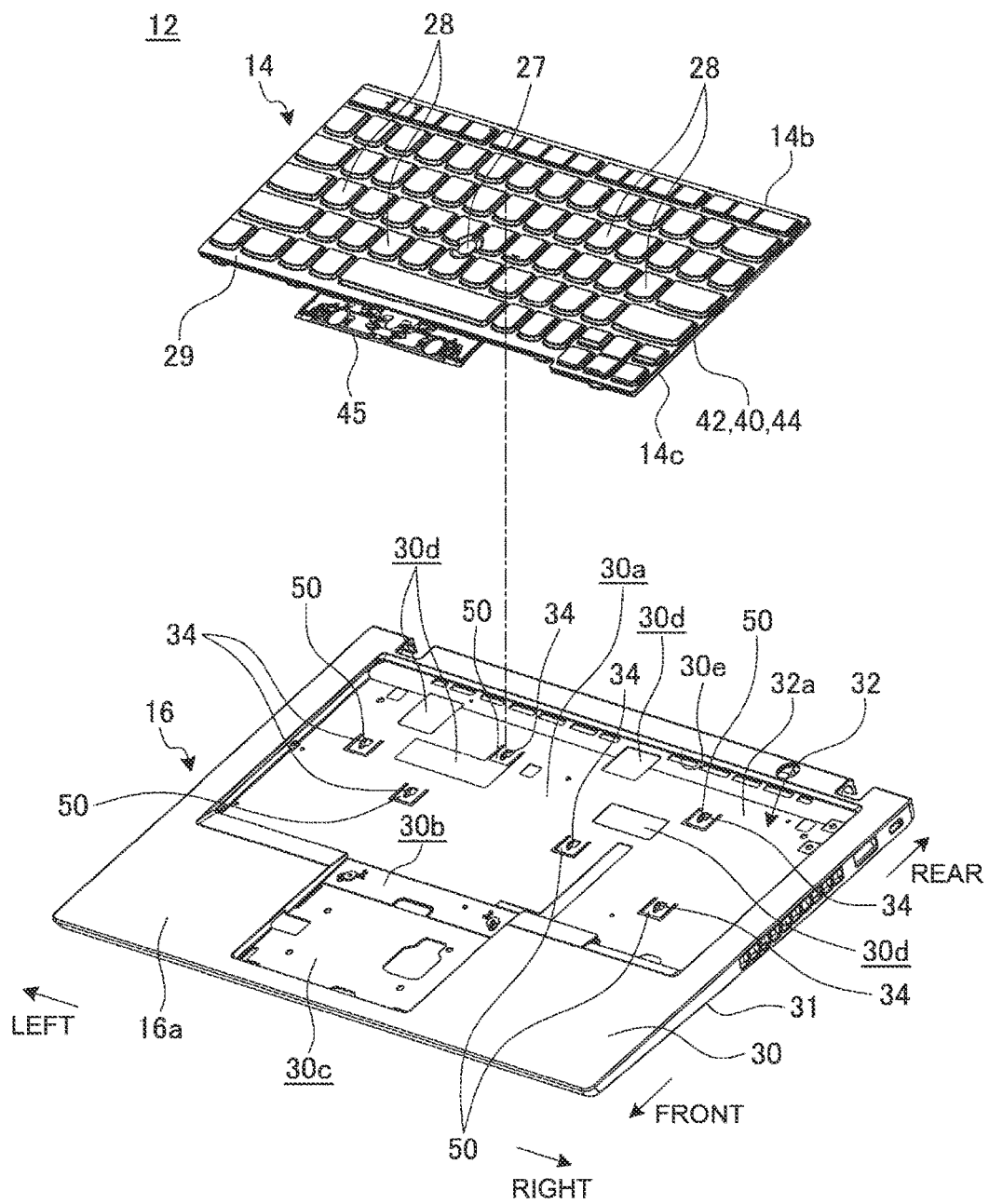
FIG. 2 is an exploded perspective view illustrating how to attach a keyboard unit to a main body chassis.

Subsequently, the coupled structure 10 of the keyboard unit 14 and the main body chassis 16 is described. FIG. 2 is an exploded perspective view showing the attachment of the keyboard unit 14 to the main body chassis 16.

As shown in FIG. 2, the main body chassis 16 has a thin box shape including an upper cover 30 and a lower cover 31. The upper cover 30 has a storage recess 30a for storage of the keyboard unit 14 on the upper face 16a, and the storage recess 30a has a shallow bathtub-like shape corresponding to the outer shape of the keyboard unit 14. The storage recess 30a is formed on the side of an upper face (front face) 32a of a support plate (a plate-like part) 32 provided in a position one level lower than the upper face 16a of the upper cover 30. That is, the upper face 32a of the support plate 32 is a bottom face of the storage recess 30a. The support plate 32 is a plate-like part on which the keyboard unit 14 is put, and partitions the inside of the main body chassis 16 into an upper part where the keyboard unit 14 is disposed and a lower part where the board, the arithmetic processing unit, etc. are installed. The support plate 32 has a plurality of hook members 34 in appropriate positions of the upper face 32a, and the hook members 34 protrude from the upper face 32a. On the front center of the storage recess 30a, a button storage recess 30b and a pad storage recess 30c are formed. The button storage recess 30b is the place to attach the push buttons 23 to 25, and the pad storage recess 30c is the place to attach the touchpad 26. Furthermore, a plurality of holes 30d for wires (not shown) from the keyboard unit 14 are formed in appropriate positions of the support plate 32.

The keyboard unit 14 has a top-mount structure, i.e., the keyboard unit is mounted on the storage recess 30a by placing it from the above. For the attachment, some or all of the hook members 34 protruding from the upper face 32a are engaged with engagement holes 36 (see FIGS. 3A and 3B) formed on a lower face of the frame 29 of the keyboard unit 14, and thereby the keyboard unit 14 can be attached to the main body chassis 16.

Figure 3A:
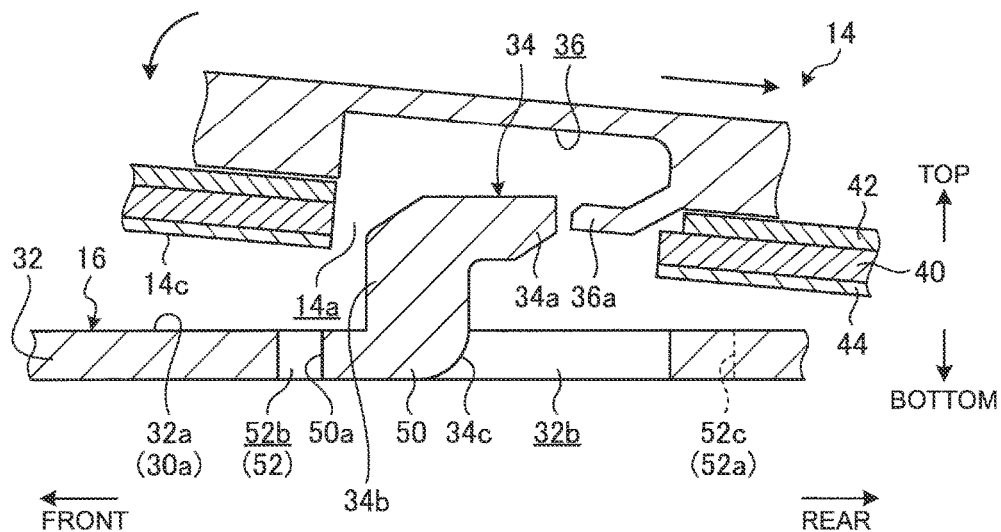
FIG. 3A is a cross-sectional side view schematically showing the cross-sectional structure of a hook member and its surrounding in a state just before the keyboard unit is attached to the main body chassis.
Figure 3B:
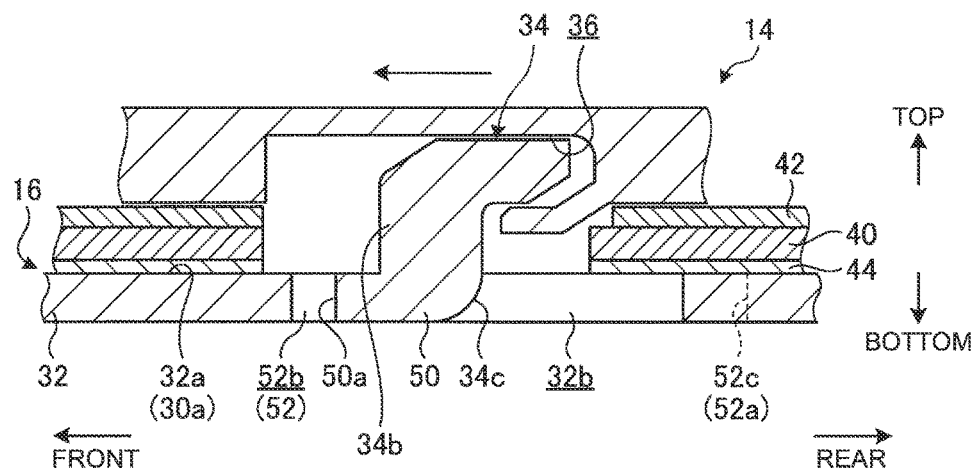
FIG. 3B is a cross-sectional side view in a state where the hook member shown in FIG. 3A is engaged with an engagement hole.

FIG. 3A is a cross-sectional side view schematically showing the cross-sectional structure of the hook member 34 and its surrounding in a state before the keyboard unit 14 is attached to the main body chassis 16. FIG. 3B is a cross-sectional side view in a state where the hook member 34 shown in FIG. 3A is engaged with the engagement hole 36.

As shown in FIGS. 3A and 3B, the keyboard unit 14 includes a base plate 40, a membrane sheet 42 and a backlight sheet 44.

The base plate 40 is a plate to attach the keys 28. The base plate 40 is formed by performing lancing and blanking processes on, for example, a 0.3-millimeter-thick metal plate member, such as a stainless steel plate or an aluminum plate. Respective keytops of the keys 28 are vertically movably supported on the side of an upper face of the base plate 40 by means of a guide mechanism (not shown) and a rubber dome (not shown). The guide mechanism is, for example, a pantograph mechanism that couples lower faces of the keytops and the upper face of the base plate 40. The rubber dome is, for example, a dome-shaped member made of an elastic material having flexibility, such as silicone rubber, and is disposed between the membrane sheet 42 and the keytops. The base plate 40 has a button plate 45 protruding forward in the front center thereof (see FIG. 2). The button plate 45 is a support of the push buttons 23 to 25. The button plate 45 is stored and disposed in the button storage recess 30b of the main body chassis 16.

The membrane sheet 42 is stacked on the upper face of the base plate 40. The membrane sheet 42 is a switch sheet having a three-layered structure in which a contact is closed, for example, when the sheet is pressed. The membrane sheet 42 is configured to close a contact, for example, when a position at which a fixed contact and a movable contact overlap each other is pressed, and thereby the fixed contact and the movable contact come into close contact with each other. The membrane sheet 42 may be stacked on the side of a lower face of the base plate 40. The above-described rubber dome presses the membrane sheet 42 when any key 28 is pressed down, and restores the key 28 to its original position when the key 28 is released from the pressing-down operation.

The backlight sheet 44 is stacked on the lower face of the base plate 40. The backlight sheet 44 includes, for example, a resin optical guide plate or the like having translucency, such as PET, polycarbonate, or acrylic, and has light sources, such as LED devices, in the right and left center parts thereof or the right and left ends thereof. The backlight sheet 44 guides light emitted from the light sources in the right and left directions and reflects the light on a light reflecting face to irradiate the keytops of the keys 28 with the light from their back faces. Instead of the backlight sheet 44, a waterproof sheet made of rubber or resin may be used.

The frame 29 has the engagement holes 36 in appropriate positions on the lower face thereof. The frame 29 is fixed to the base plate 40 via an engagement structure or a screw structure using through holes formed in some spots of the membrane sheet 42. The engagement holes 36 have a shape that allows the hook member 34 to be inserted thereinto and also allows the hook member 34 to move in an engagement direction (backward). The engagement holes 36 have a plate-like engagement part 36a with which a claw 34a of the hook member 34 is engaged on the back side of the hook member 34 in the engagement direction. The keyboard unit 14 has through holes 14a into which the hook members 34 can be inserted; the through holes 14a are located in positions overlapping with lower parts of the engagement holes 36. The through holes 14a go through the membrane sheet 42, the base plate 40, and the backlight sheet 44 from top to bottom.

The hook member 34 has a base 34b standing from the upper face 32a of the storage recess 30a and the claw 34a protruding backward from the distal end of the base 34b. In the coupled structure 10, the hook members 34 may be provided on the side of the keyboard unit 14, and the engagement holes 36 may be provided on the side of the main body chassis 16.

Therefore, when the keyboard unit 14 is attached to the main body chassis 16, a rear end face 14b of the keyboard unit 14 is pressed against a rear inner wall 30e of the storage recess 30a in a state where the keyboard unit 14 is tilted downward and backward (see FIGS. 2 and 3A). Then, the keyboard unit 14 is placed in the storage recess 30a, and its lower face 14c is put on the upper face 32a of the storage recess 30a. Accordingly, the hook member 34 is inserted into the engagement hole 36 through the through hole 14a. And then, by sliding the keyboard unit 14 forward in the storage recess 30a, the hook member 34 is engaged with the engagement hole 36 (see FIG. 3B). As a result, the keyboard unit 14 is fixed to the main body chassis 16, and thereby configures the coupled structure 10. In the present embodiment, the engagement holes 36 are configured to face the lower face 14c of the keyboard unit 14 through the through holes 14a; however, the engagement holes 36 may be formed on the base plate 40.

Figure 4:
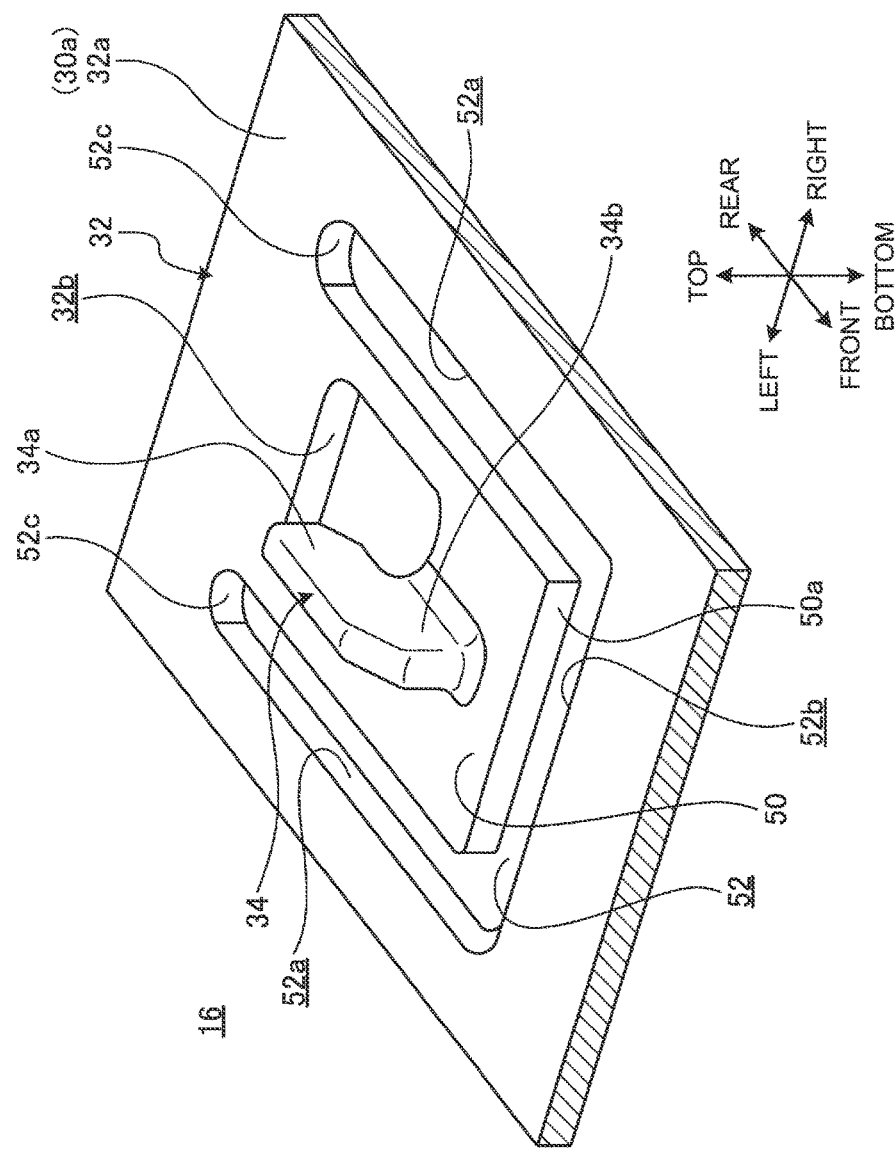
FIG. 4 is an enlarged perspective view of the hook member and its surrounding.
Figure 5:
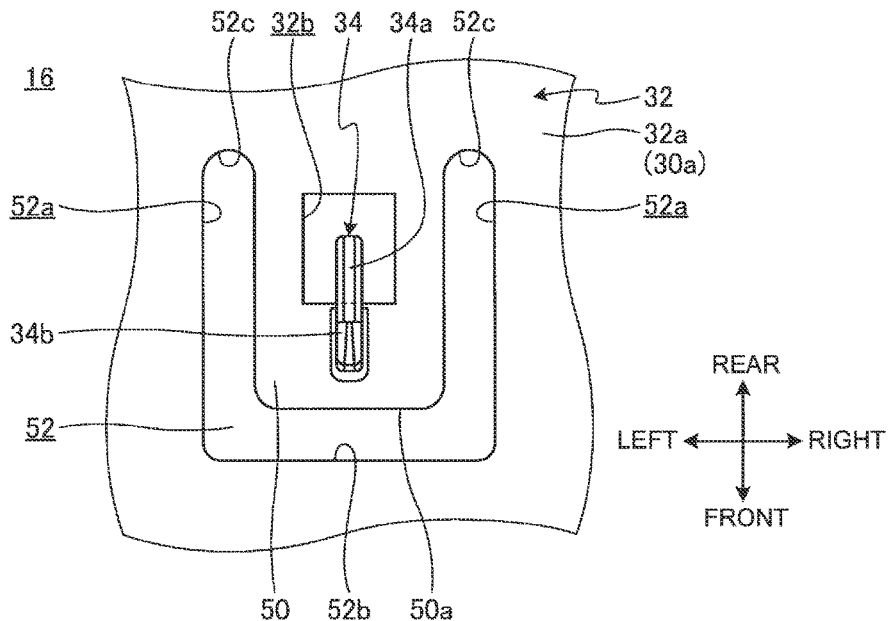
FIG. 5 is a plan view of the hook member and its surrounding shown in FIG. 4.

Subsequently, a specific configuration of the hook member 34 and its surrounding is described. FIG. 4 is an enlarged perspective view of the hook member 34 and its surrounding. FIG. 5 is a plan view of the hook member 34 and its surrounding shown in FIG. 4.

As shown in FIGS. 4 and 5, the support plate 32 has a plate spring 50, and the hook member 34 is provided on the upper face 32a of the plate spring 50. On the support plate 32, a notch-like hole 52 is formed to surround three sides: the right and left sides and the front of the hook member 34. The notch-like hole 52 is formed into a substantially U-shape in a plan view by a pair of side holes 52a, 52a and a back hole 52b. The side holes 52a are provided on the right and left sides of the hook member 34 in a width direction, and extend along the engagement direction (front-rear direction) of the hook member 34 with respect to the engagement hole 36. The back hole 52b connects between the pair of side holes 52a, 52a. The back hole 52b is provided on the back (forward) of the base 34b that is the opposite side of a protruding direction (backward) of the claw 34a from the base 34b of the hook member 34, and extends along the width direction of the hook member 34.

The plate spring 50 is formed inside the notch-like hole 52. Accordingly, a front end 50a of the plate spring 50 is capable of elastic displacement in a direction of swinging in a through-thickness direction (up-down direction) of the support plate 32 with proximal ends of the side holes 52a between ends 52c, 52c as supporting points.

Figure 7:
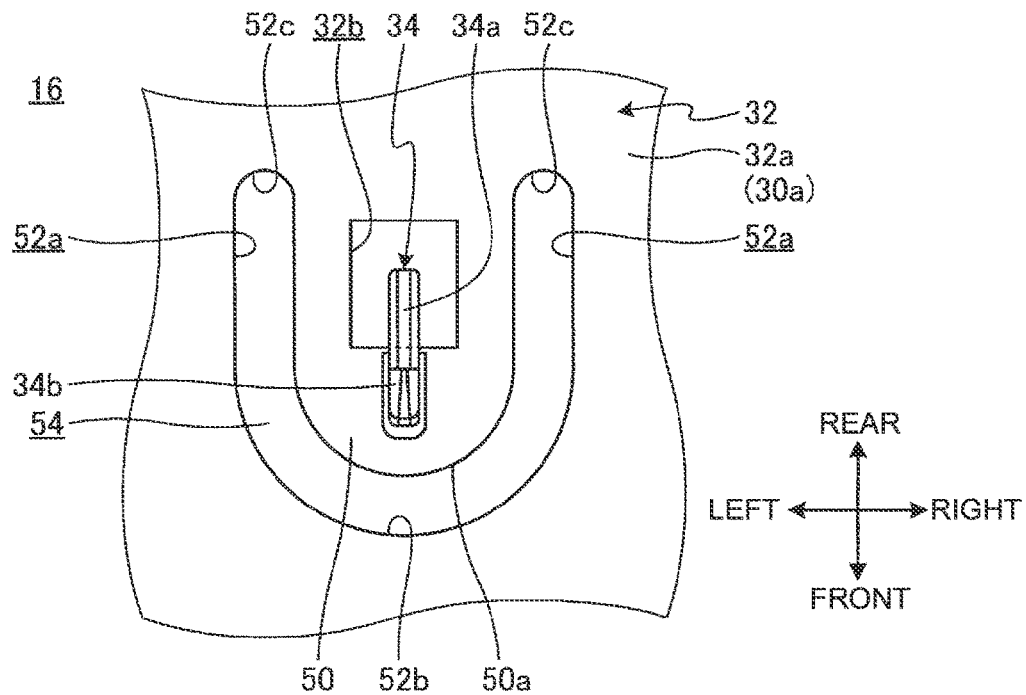
FIG. 7 is a plan view of a hook member and its surrounding according to a modification example.

In the present embodiment, the support plate 32 (and the upper cover 30) is, for example, fiber-reinforced resin (for example, GFRP) made of thermoplastic resin (matrix resin shown in FIG. 7A), such as polyethylene resin or polypropylene resin, containing reinforced fiber 64 (see FIG. 7A) such as glass fiber, and is formed by, for example, injection molding. In the present embodiment, the hook members 34 are integrally molded with the support plate 32. The claw 34a of each hook member 34 is an undercut. Accordingly, the support plate 32 has a hole 32b for a model in a position overlapping with the claw 34a. The hook member 34 has an R-shaped portion 34c in the root of the base 34b on the side of the claw 34a with respect to the support plate 32. In the present embodiment, as the hook member 34 has a configuration in which a face (a rear face) of the base 34b on the side of the claw 34a is disposed in the hole 32b, the R-shaped portion 34c is in the hole 32b. In a case of a structure in which the support plate 32 has no hole 32b, the R-shaped portion 34c may be provided in the corner between the upper face 32a of the support plate 32 on the side of the claw 34a and the base 34b. The hook members 34 and the support plate 32 (and the upper cover 30) may be made of resin not containing the reinforced fiber 64 or metal such as magnesium.

Figure 6:
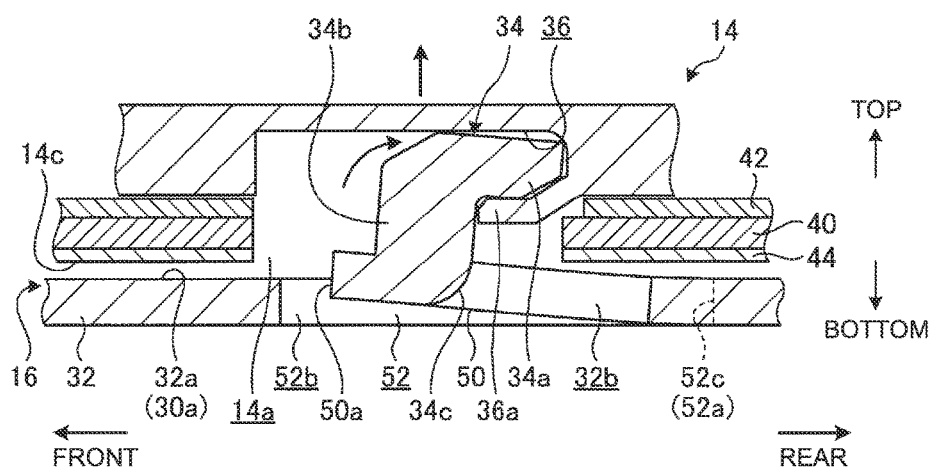
FIG. 6 is a cross-sectional side view schematically showing the cross-sectional structure of the hook member and its surrounding in a state where the keyboard unit is moved upward from the main body chassis.

Therefore, in the coupled structure 10, if the keyboard unit 14 is subjected to an impact due to falling or something and makes a relative upward movement from the main body chassis 16, the hook member 34 is subjected to an upward load from the engagement hole 36. Then, as shown in FIG. 6, the plate spring 50 on the side of the front end 50a makes an elastic upward movement with the proximal ends of the side holes 52a on the side of the ends 52c as supporting points of swinging. That is, the plate spring 50 provided with the hook member 34 is elastically displaced with respect to the peripheral part. This suppresses the occurrence of stress concentration in the boundary between the hook member 34 and the support plate 32. As a result, it is possible to prevent the root of the hook member 34 from coming off of the support plate 32, or is possible to prevent the occurrence of cracks or something in the claw 34a of the hook member 34 or its surrounding. Furthermore, in the coupled structure 10, when the plate spring 50 is elastically displaced, the hook member 34 turns in a direction in which the claw 34a is engaged with the engagement part 36a more firmly, i.e., a clockwise direction in FIG. 6. Accordingly, when the keyboard unit 14 makes a relative upward movement from the main body chassis 16, the hook member 34 is engaged with the engagement hole 36 more firmly; therefore, it is also possible to prevent the hook member 34 from being detached from the engagement hole 36.

Figure 8:
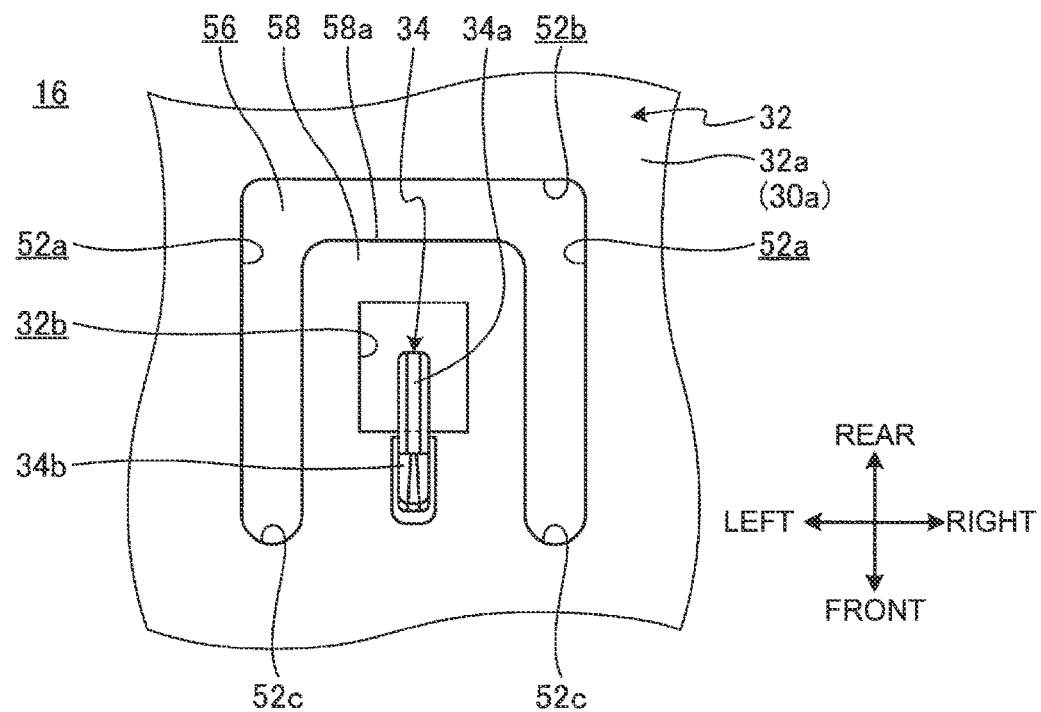
FIG. 8 is a plan view of a hook member and its surrounding according to another modification example.

Incidentally, needless to say, the shape of the plate spring 50, i.e., the shape of the notch-like hole 52 may be a shape other than those shown in FIGS. 4 and 5, as long as it allows the hook member 34 to be elastically displaced smoothly. For example, a notch-like hole 54 shown in FIG. 7 has a shape in which the arc-shaped back hole 52b connects between the right and left side holes 52a, 52a. A notch-like hole 56 shown in FIG. 8 has a shape that the notch-like hole 52 shown in FIG. 5 is inverted in the front-rear direction. Incidentally, as to a plate spring 58 formed by the notch-like hole 56 shown in FIG. 8, a rear end 58a on the distal end side of the claw 34a is lifted upward if the keyboard unit 14 makes a relative upward movement from the main body chassis 16 due to an impact or something. This causes the hook member 34 to swing in a counterclockwise direction that is opposite to the clockwise direction shown in FIG. 6. As a result, although there is not obtained the effect that the hook member 34 is engaged with the engagement hole 36 more firmly like in the plate spring 50 shown in FIG. 6, an area where the notch-like hole 52 (54) is not able to be provided, for example, because of the structure of the support plate 32 can be used effectively.

Furthermore, if it is not possible to secure the right and left side holes 52a having the same length, for example, because of the structure of the support plate 32, the notch-like hole 52 (54, 56) may have the right and left side holes 52a having different lengths in the front-rear direction. Moreover, in a case where the support plate 32 has the holes 30d near the hook members 34 as shown in FIG. 2, for example, the hole 30d may be substituted for one of the side holes 52a (or the back hole 52b).

Figure 9A:
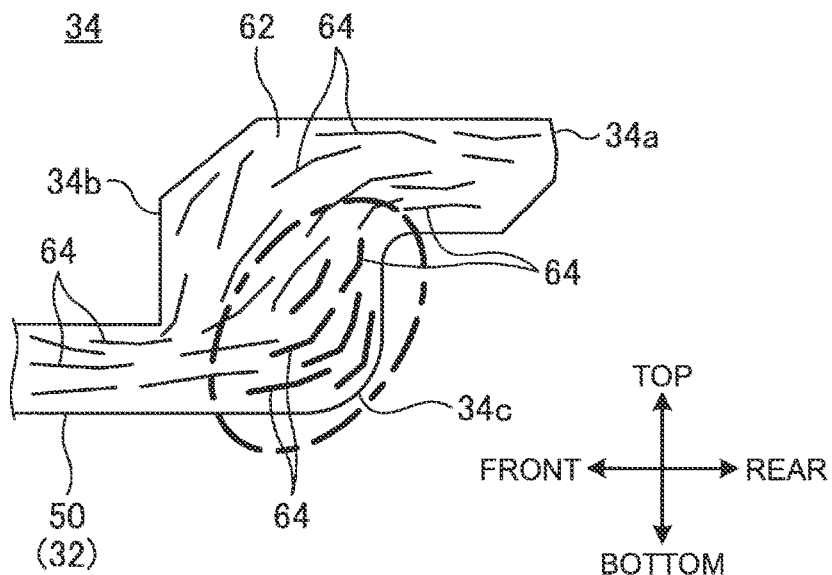
FIG. 9A is a cross-sectional side view schematically showing a configuration of a hook member having an R-shaped portion.
Figure 9B:
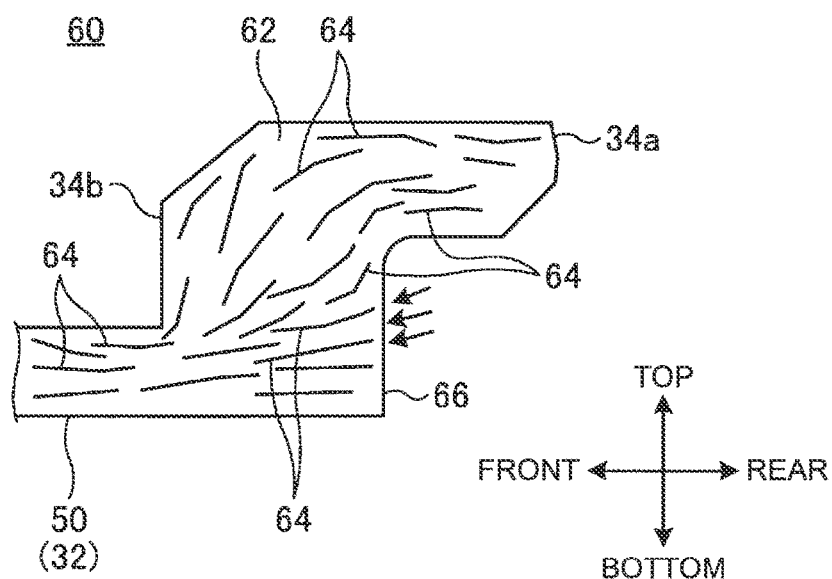
FIG. 9B is a cross-sectional side view schematically showing a configuration of a hook member having no R-shaped portion.

FIG. 9A is a cross-sectional side view schematically showing a configuration of the hook member 34 having the R-shaped portion 34c. FIG. 9B is a cross-sectional side view schematically showing a configuration of a hook member 60 having no R-shaped portion 34c. Incidentally, in the hook member 60 shown in FIG. 9B, the same reference numeral as the hook member 34 shown in FIG. 9A denotes the same or similar component, and detailed description of the component is omitted on the assumption that the component has the same or similar function and effect.

The hook member 34 in the present embodiment has the R-shaped portion 34c in the root of the base 34b with respect to the support plate 32, and is made of fiber-reinforced resin. Accordingly, as shown in FIG. 9A, the matrix resin 62 that forms the hook member 34 has a structure in which the reinforced fiber 64 extends in a direction from the plate spring 50 (the support plate 32) toward the claw 34a through the base 34b (or a direction opposite to this). At this time, like the reinforced fiber 64 enclosed by a bold dashed-dotted line in FIG. 9A for emphasis, pieces of reinforced fiber 64 are disposed near the R-shaped portion 34c in an arc along the R-shape from the plate spring 50 (the support plate 32) to the base 34b. Therefore, for example, when an upward load is applied to the hook member 34 as shown in FIG. 6, there is concern that stress concentration may occur in the root (the R-shaped portion 34c) of the base 34b extending toward the side of the claw 34a. However, in the hook member 34 in the present embodiment, the root is made extremely firm by the reinforced fiber 64 extending along the R-shaped portion 34c, and therefore it is possible to prevent the occurrence of coming off or cracks from this part.

In other words, as the hook member 34 is provided with the R-shaped portion 34c, even in a configuration without the plate spring 50, it is possible to enhance its strength. Accordingly, depending on the required performance, etc. of the coupled structure 10, the plate spring 50 can be eliminated by providing the hook member 34 with the R-shaped portion 34c provided in fiber-reinforced resin. Needless to say, using both the plate spring 50 and the R-shaped portion 34c makes it possible to prevent breakage of the hook member 34 more surely.

On the other hand, the hook member 60 shown in FIG. 9B does not have the R-shaped portion 34c in the root of the base 34b extending toward the side of the claw 34a, and therefore, a flat face 66 is provided in this part. Accordingly, around the flat face 66, the reinforced fiber 64 extending from the plate spring 50 (the support plate 32) toward the base 34b runs into the flat face 66 standing at right angle, and the reinforced fiber 64 is linearly disposed so that the end thereof faces the flat face 66. Therefore, for example, when an upward load is applied to the hook member 60, if stress concentration occurs in the root of the base 34b extending toward the side of the claw 34a in the hook member 60, there is concern that there may occur coming off or cracks starting from the end of the reinforced fiber 64 that linearly faces the flat face 66 (see arrows in FIG. 9B). However, even such a hook member 60 can suppress its own breakage by use with the plate spring 50; therefore, depending on the required performance, etc. of the coupled structure 10, the hook member 60 can be used suitably.

Needless to say, the present invention is not limited to the above-described embodiment, and can be modified freely without departing from the scope of the invention.

In the above embodiment, the keyboard unit 14 and the main body chassis 16 are shown as an example of the two members composing the coupled structure 10; however, the coupled structure 10 may be coupling of other members. Taking the electronic device 12 as an example, the coupled structure 10 may be used for coupling of the upper cover 30 and the lower cover 31 of the main body chassis 16, fixing of various electronic components in the main body chassis 16, etc. Furthermore, the coupled structure 10 may be used in an electronic device other than a laptop PC, a mechanical chassis of a device other than electronic devices, a mechanical device, etc.

The invention claimed is:
1. A coupled structure comprising:
a first member having an engagement hole;
a second member coupled to the first member; and
a hook member configured to engage the engagement hole, the hook member protruding from a surface of a plate-like part on the second member,
wherein the plate-like part has a plate spring capable of elastic displacement with respect to a peripheral part,
the hook member is on the plate-like part,
the surface of the plate-like part has a notch-like hole that surrounds three sides of the hook member and the plate spring,
the hook member has a base standing from a surface of the plate spring and a claw bending from a distal end of the base along the surface, and
the notch-like hole includes a pair of side holes on both sides of the hook member and a back hole on a back of the base that is on an opposite side of the claw in a protruding direction, the back hole connecting the side holes.
2. The coupled structure according to claim 1, wherein:
the plate-like part and the hook member are integrally molded from resin material including reinforced fiber, and the hook member has an R-shaped portion in a root thereof, the R-shaped portion protruding from the plate spring.

3. A coupled structure comprising:

a first member having an engagement hole is provided;

a second member coupled to the first member; and a hook member that protrudes from a surface of a plate-like part on the second member, and is configured to be engage the engagement hole, wherein the plate-like part and the hook member are integrally molded from resin material including reinforced fiber, wherein the plate-like part has a plate spring capable of elastic displacement with respect to a peripheral part, the hook member has a base standing from a surface of the plate spring and a claw bending from a distal end of the base along the surface, the plate-like part has a hole in a position overlapping, in a direction perpendicular to a planar surface of the plate-like part, with the claw, the hook member has an R-shaped portion in a root of the base, the R-shaped portion being in the hole, the R-shaped portion having one end that is always free of contact with the second member.

4. An electronic device comprising a coupled structure having, a first member having an engagement hole;

a second member coupled to the first member; and a hook member configured to engage the engagement hole, the hook member protruding from a surface of a plate-like part on the second member, wherein the plate-like part has a plate spring capable of elastic displacement with respect to a peripheral part, and the hook member is on the plate-like part, wherein the first member is a keyboard unit, and the second member is a chassis that the keyboard unit is mounted on an upper face thereof, wherein:

the surface of the plate-like part has a notch-like hole that surrounds three sides of the hook member and the plate spring, the hook member has a base standing from a surface of the plate spring and a claw bending from a distal end of the base along the surface, and the notch-like hole includes a pair of side holes on both sides of the hook member and a back hole on a back of the base that is on an opposite side of the claw in a protruding direction, the back hole connecting the side holes.

\* \* \* \* \*